United States Patent
Moustakas

[11] Patent Number: 6,123,768
[45] Date of Patent: *Sep. 26, 2000

[54] METHOD FOR THE PREPARATION AND DOPING OF HIGHLY INSULATING MONOCRYSTALLINE GALLIUM NITRIDE THIN FILMS

[75] Inventor: Theodore D. Moustakas, Dover, Mass.

[73] Assignee: The Trustees of Boston University, Boston, Mass.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/644,576

[22] Filed: May 10, 1996

Related U.S. Application Data

[62] Division of application No. 08/372,113, Jan. 13, 1995, Pat. No. 5,686,738, which is a continuation of application No. 08/113,964, Aug. 30, 1993, Pat. No. 5,385,862, which is a continuation of application No. 07/670,692, Mar. 18, 1991, abandoned.

[51] Int. Cl.[7] .................................................. C03B 25/14

[52] U.S. Cl. ......................... 117/105; 117/952; 438/256; 438/267; 148/DIG. 113

[58] Field of Search .................................. 437/103, 105; 148/DIG. 113; 117/105, 952; 438/265, 267

[56] References Cited

U.S. PATENT DOCUMENTS

| | | |
|---|---|---|
| 3,683,240 | 8/1972 | Pankove . |
| 3,819,974 | 6/1974 | Stevenson et al. . |
| 3,829,556 | 8/1974 | Logan et al. . |
| 4,153,905 | 5/1979 | Charmakadze et al. . |
| 4,473,938 | 10/1984 | Kobayashi et al. . |
| 4,476,620 | 10/1984 | Ohki et al. . |
| 4,589,015 | 5/1986 | Nakata et al. . |
| 4,615,766 | 10/1986 | Jackson et al. . |

(List continued on next page.)

FOREIGN PATENT DOCUMENTS

| | | |
|---|---|---|
| 3802732 | 8/1988 | Germany . |
| 4006449 | 9/1990 | Germany . |
| 64-30110 | 8/1989 | Japan . |
| 2081 | 3/1990 | Japan . |
| 2-143420 | 6/1990 | Japan . |
| 2257678 | 10/1990 | Japan . |

OTHER PUBLICATIONS

Kiode, et al., *Effect of AlN Buffer Layer on AlGaN/α–Al₂O₃ Heteroepitaxial Growth by MOVPE* (in Japanese), vol. 13, No. 4 1986, pp. 218–225.

S. Yoshida, et al., *Improvements on the electrical and luminscent properties of reactive molecular beam epitaxially grown GaN films by using AlN–coated sapphire substrates*, Appl. Phys. Lett. 42(5), Mar. 1983, pp. 427–429.

H. Amano, et al. *Effect Of The Buffer Layer in Metalorganic Vapour Phase Epitaxy of GaN on Sapphire Susbstrate*, Thin Solid Films, 163, 1988, pp. 415–420.

(List continued on next page.)

*Primary Examiner*—Robert Kunemund
*Attorney, Agent, or Firm*—Weingarten, Schurgin, Gagnebin & Hayes LLP

[57] ABSTRACT

This invention relates to a method of preparing highly insulating GaN single crystal films in a molecular beam epitaxial growth chamber. A single crystal substrate is provided with the appropriate lattice match for the desired crystal structure of GaN. A molecular beam source of Ga and source of activated atomic and ionic nitrogen are provided within the growth chamber. The desired film is deposited by exposing the substrate to Ga and nitrogen sources in a two step growth process using a low temperature nucleation step and a high temperature growth step. The low temperature process is carried out at 100–400° C. and the high temperature process is carried out at 600–900° C. The preferred source of activated nitrogen is an electron cyclotron resonance microwave plasma.

12 Claims, 4 Drawing Sheets

U.S. PATENT DOCUMENTS

| | | |
|---|---|---|
| 4,792,467 | 12/1988 | Melas et al. . |
| 4,819,057 | 4/1989 | Naito et al. . |
| 4,819,058 | 4/1989 | Nishizawa . |
| 4,855,249 | 8/1989 | Akasaki et al. . |
| 4,866,007 | 9/1989 | Taguchi et al. . |
| 4,897,149 | 1/1990 | Suzuki et al. . |
| 4,911,102 | 3/1990 | Manabe et al. . |
| 4,918,497 | 4/1990 | Edmond . |
| 4,946,547 | 8/1990 | Palmour et al. . |
| 4,946,548 | 8/1990 | Kotaki et al. . |
| 4,960,728 | 10/1990 | Shaake et al. . |
| 4,966,862 | 10/1990 | Edmond . |
| 4,966,867 | 10/1990 | Crotti et al. . |
| 4,983,249 | 1/1991 | Taguchi et al. . |
| 5,005,057 | 4/1991 | Izumiya et al. . |
| 5,006,908 | 4/1991 | Matsuoka et al. . |
| 5,010,033 | 4/1991 | Tokunaga et al. . |
| 5,015,327 | 5/1991 | Taguchi et al. . |
| 5,027,168 | 6/1991 | Edmond . |
| 5,042,043 | 8/1991 | Hatano et al. . |
| 5,063,421 | 11/1991 | Suzuki et al. . |
| 5,068,204 | 11/1991 | Kukimoto et al. . |
| 5,076,860 | 12/1991 | Ohba et al. . |
| 5,093,576 | 3/1992 | Edmond et al. . |
| 5,097,298 | 3/1992 | Ehara . |
| 5,117,267 | 5/1992 | Kimoto et al. . |
| 5,119,540 | 6/1992 | Kong et al. . |
| 5,122,845 | 6/1992 | Manabe et al. . |
| 5,140,385 | 8/1992 | Kukimoto et al. . |
| 5,173,751 | 12/1992 | Ota et al. . |
| 5,178,911 | 1/1993 | Gordon et al. . |
| 5,182,670 | 1/1993 | Khan et al. . |
| 5,192,419 | 3/1993 | Matsuura et al. . |
| 5,200,022 | 4/1993 | Kong et al. . |
| 5,205,905 | 4/1993 | Kotaki et al. . |
| 5,210,051 | 5/1993 | Carter, Jr. . |
| 5,218,216 | 6/1993 | Manabe et al. . |
| 5,237,182 | 8/1993 | Kitagawa et al. . |
| 5,243,204 | 9/1993 | Suzuki et al. . |
| 5,248,631 | 9/1993 | Park et al. . |
| 5,272,108 | 12/1993 | Kozawa . |
| 5,290,393 | 3/1994 | Nakamura . |
| 5,298,767 | 3/1994 | Shor et al. . |
| 5,304,820 | 4/1994 | Tokunaga et al. . |
| 5,306,662 | 4/1994 | Nakamura et al. . |
| 5,307,363 | 4/1994 | Hosokawa et al. . |
| 5,313,078 | 5/1994 | Fujii et al. . |
| 5,323,022 | 6/1994 | Glass et al. . |
| 5,329,141 | 7/1994 | Suzuki et al. . |
| 5,334,277 | 8/1994 | Nakamura . |
| 5,338,944 | 8/1994 | Edmond et al. . |
| 5,359,345 | 10/1994 | Hunter . |
| 5,385,862 | 1/1995 | Moustakas .............................. 437/107 |

OTHER PUBLICATIONS

H. Amano, et al., *Metalorganic vapor phase epitaxial growth of a high quality GaN film using an AlN buffer layer*, Appl. Phys. Lett. 48 (5), Feb. 1986, pp. 353–355.

M.R.H. Khan, et al, *Edge Emission of $Al_xGa_{1-x}N$*, Solid State Communications, vol. 60, No. 6, 1986, pp. 509–512.

H. Amano, et al., *P–Type Conduction in Mg–Doped GaN Treated with Low–Energy Elefctron Beam Irradiation (LEEBI)*, Japanese Journal of Applied Physics, vol. 28, No. 12, Dec. 1989, pp. L2112–L2114.

T. Nagatgomo, et al., *Epitaxial Growth of GaN films by Low Pressure Metalorganic Chemical Vapor Dispersition*, Abstract # 1156. 104b Extended Abstracts Fall Meeting, Honolulu, Hawaii, Oct. 1987, pp. 1602–1603.

H. Kawakami, et al., *Epitaxial Growth of AlN Film with an Initial–Nitriding Layer on $\alpha$–$AL_2O_3$ Substrate*, Japanese Journal of Applied Physics, vol 27, No. 2, Feb. 1988, pp. L161–L163.

I. Akasaki, et al., *Effect of AlN Buffer Layer on Crystallographic Structure and On Electrical and Optical Properties of GaN and $G_1Al_{1-x}N$ ($0<x\leq0.4$) Films Grown on Sapphire Substrate by MOVPE*, Journal of Crystal Growth 98, 1989, pp. 209–219.

B. Goldenberg, et al., *Ultraviolet and Violet Light–Emitting GaN Diodes Grown By Low–Pressure Metalorganic Chemical Vapor Deposition*, Appl. Phys. Lett. 62(4), Jan. 1993, pp. 381–383.

T. Mariizumi, et al., *Epitaxial Vapor Growth of ZnTe on InAs*, Japan J. Appl. Phys. 9(1970)m pp. 849–850.

I. Akasaki et al., *Photoluminscene of Mg–doped p–type GaN and electroluminescence of GaN p–n junction LED*, Journal of Luminescene 48 & 49, 1991, pp. 666–670.

T.D. Moustakas, et al., *A Comparative Stude of GaN Films Grown on Different Faces of Sapphire by ECR–Assisted MBE*, Mat. Res. Soc. Symp. Proc., vol. 242, 1992, pp. 427–432.

T. Lei, et al., *A Comparative Study of GaN Epitaxy on Si(001) and SI(111) Substrates*, Mat. Res. Soc. Symp. Proc., vol. 242, 1992, pp. 433–439.

C.R. Eddy, Jr. et al., *Growth of Gallium Nitride Thin Film By Electron Cyclotron Resonance Microwave Plasma–Assisted Molecular Beam Epitaxy*, J. Appl. Phys. 73, Jan. 1993, pp. 448–455.

R.J. Molnar, et al., *Electron Tranpsort Mechanism in Gallium Nitride*, Appl. Phys. Lett. 62 (1), Jan. 1993, pp. 72–74.

J.S. Foresi, et al., *Metal Contacts to Gallium Nitride*, Appl. Phys. Lett. 62 (22), May. 5, 1993, pp. 2859–2861.

T. Lei, et al, *Heteroepitaxy, Polymorphism, and Faulting in GaN Thin Films on Silicon and Sapphire Substrates*, J. Appl. Phys. 74 (7), Oct. 1993, pp. 4430–4437.

M. Fanciulli et al., *Conduction–electron spin resonance in zinc–blende GaN Thin Films*, Physical Review B, vol. 48, No. 20, Nov. 1993, pp. 15144–15147.

T. D. Moustakas, et al., *Growth and Doping of GaN Films by ECR–Assisted MBE*, Mat. Res. Soc. Symp. Proc., vol. 281, 1993, pp. 753–763.

Sitar, et al. *Design and performance of an electron cyclotron resonance plasma source for standard molecular beam epitaxy equipment*, Rev. Sci. Instrum., vol. 61, No. 9, Sep. 1990, pp. 2407–2411.

*Programming of the 1991 March Meeting, Bulletin of the American Physical Society* , vol. 36, No. 3, Mar. 1991, pp. 543–544.

T. Lei, et al., *Epital Growth of zinc–blende and wurtzinc gallium nitride thin films on (001) silicon*, Appl. Phys. Lett. 59(8), Aug. 1991, pp. 944–946.

T. Lei, et al., *Epitaxial Growth and Characterization of zinc–blende gallium nitride on (001) silicon*, Appl. Phys. Lett. 59 (8), Aug. 1991, pp. 944–946.

A. Yoshikawa, et al., *Effects of Ar ion laser irradiation on MOVPE pf ZnSe using DMZn and DMSe as reactants*, Journal of Crystal Growth 107, 1991, pp. 653–658.

M. S. Brandt, et al., *Local Vibrational Modes in Mg–Doped Gallium Nitride, Physical Review B. Condensed Matter*, vol. 49, No. 20, May. 1994, pp. 14, 758–14, 761.

H. Teisseyre, et al., *Temperature dependence of the energy gap in GaN bulk single crystals and epitaxial layer*, J. Appl. Phys. 76 (4), Aug. 1994, pp. 2429–2434.

S.N. Basu, et al., *Microstructures of GaN Films Deposited On (001) and (111) Si Substrates Using Electron Cyclotron Resonance Assisted–Molecular Beam Epitaxy*, J. Mater, Res., vol. 9 No. 9 Sep. 1994, pp. 2370–2378.

R.J. Molnar, et al., *Growth of Gallium Nitride by Electon–Cyclotron Resonace Plasma–Assisted Molecular- –Beam Epitaxy: The Role of Charged Species*, J. Appl. Phys. 76(8), Oct. 1994, pp. 4587–4595.

M. Leszcyski, et al., *Thermal Expansion of Gallium Nitride*, J. Appl. Phys. 76 (8), Oct. 1994, pp. 4909–4911.

M. Manfra, et al., *Reactivates Etching of GaN Thin Films*, Mat. Res. Soc. Symp. Proc. vol. 324, 1994, pp. 477–480.

R.J. Molnar, *Blue–Violet Light Emitting Gallium Nitride p–n Junctions Grown by Electron Cyclotron Resonance–assisted Molecular Beam Epitaxy*, Applied Physics Letters, Jan. 1995, Three pages.

J.T. Glass, et al., *Diamond, Silicon Carbide and Related Wide Bandgap Semiconductor*, Materials Research Society Symposium Proceedings, vol. 162, pp. 121–122.

H. Armano, et al., *Stimulated Emission Near Utraviolet at Room Temperature from a GaN Film Sapphire by MOVPE Using an AIn Buffer Layer*, Japanese Journal of Applied Physics, vol. 29, No. 2, Feb, pp. L205–L206.

KRI Fax News #53, *Commericalization of GaN Blue LED With the Highest Reported Light Intensity in the World, Japanese R&D Trend Analysis*, Jan. 1990.

G. Menon, *Growth if Intrinsic Monocrystalline Gallium Nitride Thin Films by Electron Cyclotron Resonance Microwave Plasma Assisted Molecules Beam Epitaxy*, Boston University College of Engineering Thesis.

T. Lei, *Heteroepitaxial Growth Nitride And Native Defect Formation In III–V Nitride*, Boston University Graduate School Dissertation.

R. Molnar, *The Growth and Doping of Gallium Nitride (GaN) Thin Films by Electron Cyclotron Resonance Plasma Assisted Molecular*, Boston Univerisity, College of Engineering, Dissertation.

"Stimulated Emission Near Ultraviolet at Room Temperature from a GaN Film on Sapphire by MOVPE Using an AIN Buffer Layer", Hiroshi Amano et al., Japanese Journal of Applied Physics, 29, No. 2, pp. L205–L206 (Feb. 1990).

"P–Type Conduction in MG–Doped GaN Treated with Low–Energy Electron Beam Irradiation (LEEBI)", Hiroshi et al., Japanese Journal of Applied Physics, 28 No. 12, pp. L2112–L2214 (Dec. 1989).

"Growth of High–Resisivity Wurtzile and Zincblende Structure Single Crystal Gan By Reactive–Ion Molecular Beam Epitaxy", R.C. Powell et al., Materials Research Society Symopium Proceeding, 162, pp. 525–530 (Nov./Dec., 1989).

"Growth of Cubic GaN Films on (100) Si by ECR Assisted MBE", T. Lei et al., Bulletin of the American Physical Society, 36 N. 3 (Mar. 1991).

"Growth of Single Crystalline GaN Films on the R–place of Sapphire by ECR Assisted", C.R. Eddy et al., Bulletin of the American Physical Society, 36 No. 3 (Mar. 1991).

"Electron Beam Effects on the Luminescence of Zinc–Doped GaN", Hiroshi Amano et al., 40 and 41, pp. 121–122 (Feb. 1988).

"Commerical of GaN Blue LED with The Highest Reported Light in the World", unknown author, Japanese R & D Trend Anaylsis, 33 ( Jan. 1991).

Sitar, Z., Design and Performance of an Electron Cyclotron Resonace Plasma Source for Standard Molecular Beam Epitaxy Equipment, Rev. Sci. Instrum., 61(9), Sep. 1990, pp. 2407–2411.

Maruska et al., "Mechanism . . . Diodes,"Solid. State.Elec., vol. 17, 1994, pp. 1171–1179.

Boulou et al., "Light–emitting diodes based on GaN,"*Phil- ips.Tech.Rev.*

T.D. Moustakas, et al., *Growth and Doping of GaN Films by ECR–Assisted MBE*, Mat. Res. Soc. Symp. Proc., vol. 281, 1993, pp. 753–763.

R.J. Molnar, et al., *High Mobility GaN Films Produced by ECR–Assisted MBE*, Mat. Res Soc. Symp. Proc., vol. 281, 1993, pp. 765–768.

T.D. Moustakas, et al., *Growth of GaN by ECR–Assisted MBE*, Physica B 185 (1993) pp. 36–49.

M.S. Brandt, et al., *Hydrogenation of Gallium Nitride*, MRS Meeting, 1993, 6 pp.

R. Singh, et al., *Intensity Dependence of Photoluminescence in GaN Thin FIlms*, Appl. Phys. Lett. 64 (3), 1/94, pp. 336–338.

M.S. Brandt, et al., *Hydrogenation of p–type gallium nitride*, Applied Physics Letters, vol. 64, No. 17, Apr. 1994, pp. 2264–2266.

H. Amano, et al., *Electron Beam Effects on Blue Luminescence of Zinc–Doped GaN,* Journal of Luminescence 40 & 41, 1988, pp. 121–122.

"Growth of GaN Films on the a–plane of Sapphire by ECR Assisted MBE", G. Merion et al., Bulletin of the American Physical Society, 36 NO. 3 (Mar. 1991).

METHOD FOR THE PREPARATION AND DOPING OF HIGHLY INSULATING MONOCRYSTALLINE GALLIUM NITRIDE THIN FILMS

This application is a division of application Ser. No. 08/372,113, filed Jan. 13, 1995 entitled "METHOD FOR THE PREPARATION AND DOPING OF HIGHLY INSULATING MONOCRYSTALLINE GALLIUM NITRIDE THIN FILMS" now U.S. Pat. No. 5,686,738, which is a continuation of application Ser. No. 08/113,964, filed Aug. 30, 1993, now U.S. Pat. No. 5,385,862, which is a continuation of Ser. No. 07/670,692, filed Mar. 18, 1991, which is abandoned.

BACKGROUND OF THE INVENTION

This invention relates to a method of preparing monocrystalfine gallium nitride thin films by electron cyclotron resonance microwave plasma assisted molecular beam epitaxy (ECR-assisted MBE). The invention further relates to a method for the preparation of n-type or p-type gallium nitridie (GaN) films.

Efforts have been made to prepare monocrystalline GaN because of its potentially useful electrical and optical properties. GaN is a potential source of inexpensive and compact solid-state blue lasers. The band gap for GaN is approximately 3.4 eV, which means that it can emit light on the edge of the UV-visible region. For intrinsic GaN, the carrier concentration, $n_i$, is $5.2 \times 10^3$ cm$^{-3}$, the mobility is 330 cm$^2$V$^{-1}$s$^{-1}$ and the resistivity is $3.6 \times 10^{12}$ $\Omega$-cm.

Despite the desirability of a monocrystalline GaN film, its development has been hampered by the many problems encountered during the growth process. Previous attempts to prepare monocrystalline GaN films have resulted in n-type films with high carrier concentration. The n-type characteristic is attributed to nitrogen vacancies in the crystal structure which are incorporated into the lattice during growth of the film. Hence, the film is unintentionally doped with nitrogen vacancies during growth. Nitrogen vacancies affect the electrical and optical properties of the film.

ECR-assisted metalorganic vapor phase epitaxy gave GaN films that were highly conductive and unintentionally doped n-type (S. Zembutsu and T. Sasaki *J. Cryst. Growth* 77, 25–26 (1986)). Carrier concentrations and mobilities were in the range of $1 \times 10^{19}$ cm$^{-1}$ and 50–100 cm$^2$V$^{-1}$s$^{-1}$, respectively. Efforts to dope the film p-type were not successfiul. The carrier concentration was reduced by compensation, that is, the effect of a donor impurity is "neutralized" by the addition of an acceptor impurity.

Highly resistive films were prepared by sputtering using an ultra-pure gallium target in a nitrogen atmosphere. The films were characterized n-type and the high resistivity was attributed to the polycrystalline natures of the films (E. Lakshmi, et al. *Thin Solid Films* 74, 77 (1977)).

In reactive ion molecular beam epitaxy, gallium was supplied from a standard effusion cell and nitrogen was supplied by way of am ionized beam. Monocrystailine films were characterized n-type, but higher resistivities of $10^6$ $\Omega$-cm and relatively low carrier concentrations and mobilities ($10^{14}$ cm$^{-3}$ and 1–10 cm$^2$V$^{-1}$s$^{-1}$, respectively) were obtained (R. C. Powell, et al. in "Diamond, Silicon Carbide and Related Wide Bandgap Semiconductors" Vol. 162, edited by J. T. Glass, R. Messier and N. Fujimori (Material Research Society, Pittsburgh, 1990) pp.525–530).

The only reported p-type GaN was a Mg-doped GaN treated after growth with low energy electron beam irradiation. P-type conduction was accomplished by compensation of n-type GaN (H. Amano et al. *Jap. J Appl. Phys.* 28(12), L2112–L2114 (1989)).

Current methods of preparing GaN do not permit control of nitrogen vacancies within the lattice. Thus it has not been possible to prepare intrinsic GaN. Additionally, it is desirable to control the doping process in GaN films, thereby enabling the production of p-n junctions. The present invention presents a method to prepare near-intrinsic monocrystalline GaN films and to selectively dope these films n- or p-type.

SUMMARY OF THE INVENTION

The method according to this invention for preparing highly insulating near-intric monocrystalle GaN films uses ECR-assisted MBE. In a preferred embodiment, a molecular beam source of Ga and an activated nitrogen source is provided within an MBE growth chamber. The desired substrate is exposed to Ga and activated nitrogen. A film is epitaxally grown in a tvwo step process comprising a low temperature nucleation step and a high temperature growth step. The nucleation step preferably occurs by exposure of the substrate to gallium and a nitrogen plasma at a temperature in the range of 100–400° C. and the high temperature growth step is preferably carried out in the temperature range of 600–900° C. Preferred substrates include, but are nct limited to, (100) and (111) silicon and (0001), (11–20) and (1–102) sapphire, (111) and (100) gallium arsenide, magnesium oxide, zinc oxide and silicon carbide. The preferred source of activated nitrogen species is a nitrogen plasma which call be generated by electron cyclotron resonance microwave plasma or a hot tungsten filament or other conventional methods.

In a preferred embodiment, the nitrogen plasma pressure and Ga flux pressure are controlled, thus preventing the beading of metallic gallium on the film surface and the forming of nitrogen vacancies within the lattice. The Ga flux is preferably in the range of $2.0–5.0 \times 10^{-7}$ torr. There is preferably an overpressure of nitrogen in the growth chamber, more preferably in the range of $10^{-3}$–$10^{-5}$ torr.

In yet another preferred embodiment, the low temperature nucleation step includes exposure of the substrate to Ga and nitrogen for a period of time in the range of 3–15 minutes. A film with a thickness of 200–500 Å is deposited, which is amorphous at the low temperatures of the nucleation step. The amorphous film can be crystallized by heating at 600–900° C. in the presence of activated nitrogen. Subsequent treatment at higher temperatures, preferably 600–900° C., results in the epitaxial growth of monocrystalline near-intrinsic GaN film. Preferred thickness of the growth layer is in the range of 0.5–10 $\mu$m.

In another aspect of this invention, the monocrystaLlne GaN film is preferentially doped n- or p-type. To generate a p-type semiconductor, the MBE growth chamber is equipped with Ga, activated nitrogen and acceptor sources. Acceptor sources include Group II elements such as Be, Zn, Cd, and Ca. The substrate is bombarded with electrons either by applying a positive bias to the substrate surface or a metal grid placed directly in front of the substrate. Conditions for low and high temperature deposition are as described above. Exposing the substrate to Ga, nitrogen and acceptor sources results in a doped GaN film, whereby the acceptor takes on an electron and is incorporated into the lattice as a negatively charged species. A charged acceptor species requires less energy to incorporate into the GaN lattice than a neutral acceptor. To dope the material n-type the substrate is bombarded with positive ions by biasing either the substrate or the grid negatively. Thus, the donor impurities incorporate into the GaN in their charged state. This requires less energy than to incorporate a neutral donor species. Suitable donors include Groups IV amd VI elements.

Practice of this invention affords near-intrinsic GaN films with resistivities of up to $10^{10}$ ohms-cm and mobilities of 100 cm$^2$V$^{-1}$s$^{-1}$ at 200° C. P-type and n-type semiconductors can be selectively prepared simply by choice of surface or grid bias and impurity source. It is possible to efficiently manufacture p-n junctions using the methods of this invention.

DESCRIPTION OF THE PREFERRED EMBODIMENT

The unintentional doping of GaN has been attributed to the formation of nitrogen vacancies in the GaN lattice. GaN decomposes (and loses nitrogen) at about 650° C., well below the processing temperatures of the above processes (>1000° C.). Therefore, the growth process itself provides sufficient thermal energy for vacancy formation. Growth processes at lower temperatures should reduce the number of nitrogen vacancies in the lattice, prevent the unintentional n-type doping of the GaN lattice and result in intrinsic GaN.

The practice of the present invention forms GaN at significantly lower processing temperatures using an activated nitrogen source. An ECR microwave nitrogen plasma is the preferred activated nitrogen source. A two step heating process permits the formation of monocrystalline GaN it lower processing temperatures.

Figure 1:
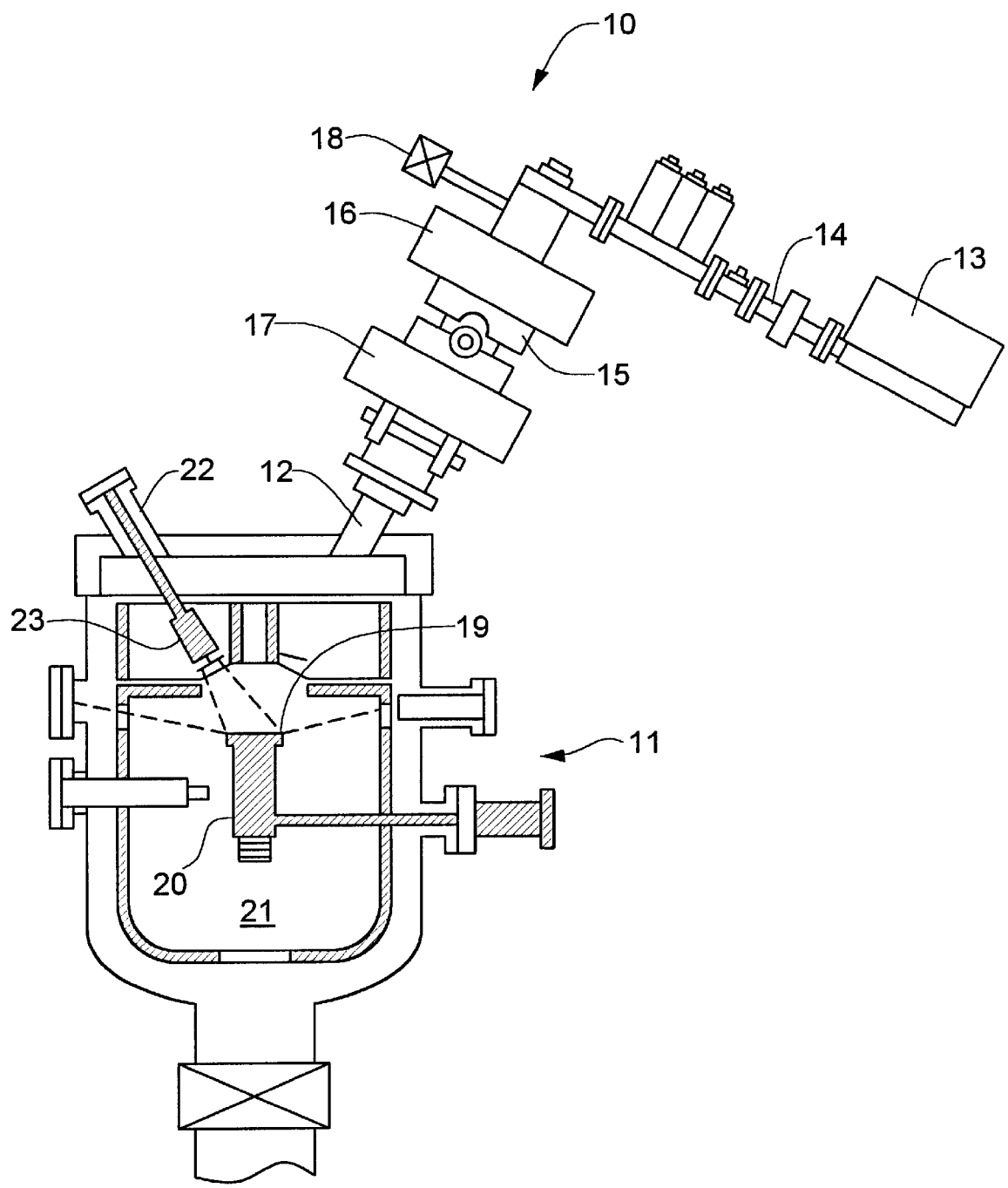
FIG. 1 is a cross-sectional view of an ECR-assisted MBE growth chamber.

The ECR-MBE system used in this invention is shown in FIG. 1. An ECR-system 10 was integrated with an MBE system 11 by attaching the ECR system 10 to an effusion port 12. The ECR system includes a microwave generator 13, a waveguide 14, a high vacuum plasma chamber 15, and two electromagnets 16 and 17. The microwaves at 2.43 GHz are created in the microwave generator 13 and travel down the rectangular waveguide 14. The microwave power (100–500 W) passes from the waveguide 14 into the plasma chamber 15. Nitrogen flows into the plasma chamber 15 through a mass flow controller 18. The mass flow controller 18 maintains an adjustable constant flow rate. The plasma chamber 15 is surrounded by the two electromagnets 16 and 17. The upper magnet 16 is powered by a 2 kW power supply (not shown) and the lower magnet 17 is powered by a 5 kW power supply (not shown). Positioning of the electromagnets in this way results in a more intense and stable plasma.

The upper electromagnet 16 sets the free electrons in the chamber 15 into cyclotron orbits. The cyclotron frequency is dependent upon the strength of the magnetic field and the electron charge-to-mass ratio. Since all the electrons assume cyclotron orbits, the energy lost in random motion and collisions is reduced. Additionally, the plasma will be confined to the center of the chamber 15. The magnetic field is adjusted such that the frequency of oscillation of the microwaves is exactly equal to the cyclotron frequency of the electrons. N$_2$ is then introduced into the chamber through the mass flow controller 18 and is decomposed to high energy atomic and ionic nitrogen species by impact with the high energy electrons. The lower electromagnet 17 then guides the ions through the effusion port 12 towards a substrate 19 which is positioned on a continuous azimuthal rotation (C.A.R.) unit 20 in a growth chamber 21 of the MBE system 11. The C.A.R. 20 can be rotated between 0 and 120 rpm. On certain substrates, GaN films grow in the wurtzitic structure and on others in the zincblende structure. Such substrates include for example sapphire (GaN in wurtzitic structure) and Si(100) (GaN in the zincblende structure). Gallium flux is generated in a Knudsen effusion cell 22.

In a typical process, the substrate 19 was sputter-etched by the nitrogen plasma at 600° C. The substrate was cooled down to 270° C. in the presence of the nitrogen plasma. A Ga shutter 23 was then opened to deposit the initial buffer layer of GaN. The use of an activated nitrogen source permitted the deposition of GaN at this low temperature. The buffer layer was allowed to nucleate over ten minutes and then the Ga shutter 23 was closed to stop the nucleation of the film. The substrate was then brought slowly to 600° C. at the rate of 4° C. every 15 seconds in the presence of the nitrogen plasma. The nitrogen overpressure also helped reduced the formation of nitrogen vacancies.

Once at 600° C., the substrate 19 was kept at this temperature for 30 minutes in the presence of nitrogen plasma to ensure that the GaN buffer layer had crystallized. The Ga shutter 23 was opened once again to grow the GaN monocrystalline film. The thickness of the film was about 1 μm, although in theory there is no limitation to film thickness. Nitrogen pressure and gallium flux are kept constant during the entire process.

The two step growth process allows for the nucleation or a buffer layer. The buffer layer is grown at a temperature in the range of 100°–400° C. Because the temperature is low, the probability of nitrogen vacancy formation is reduced. As the temperature increases to 600° C., the amorphous film crystallizes. Any further growth takes place on the crystallized GaN buffer layer. The films grown by this two step process are superior to those grown by a one step growth process.

Figure 2A:
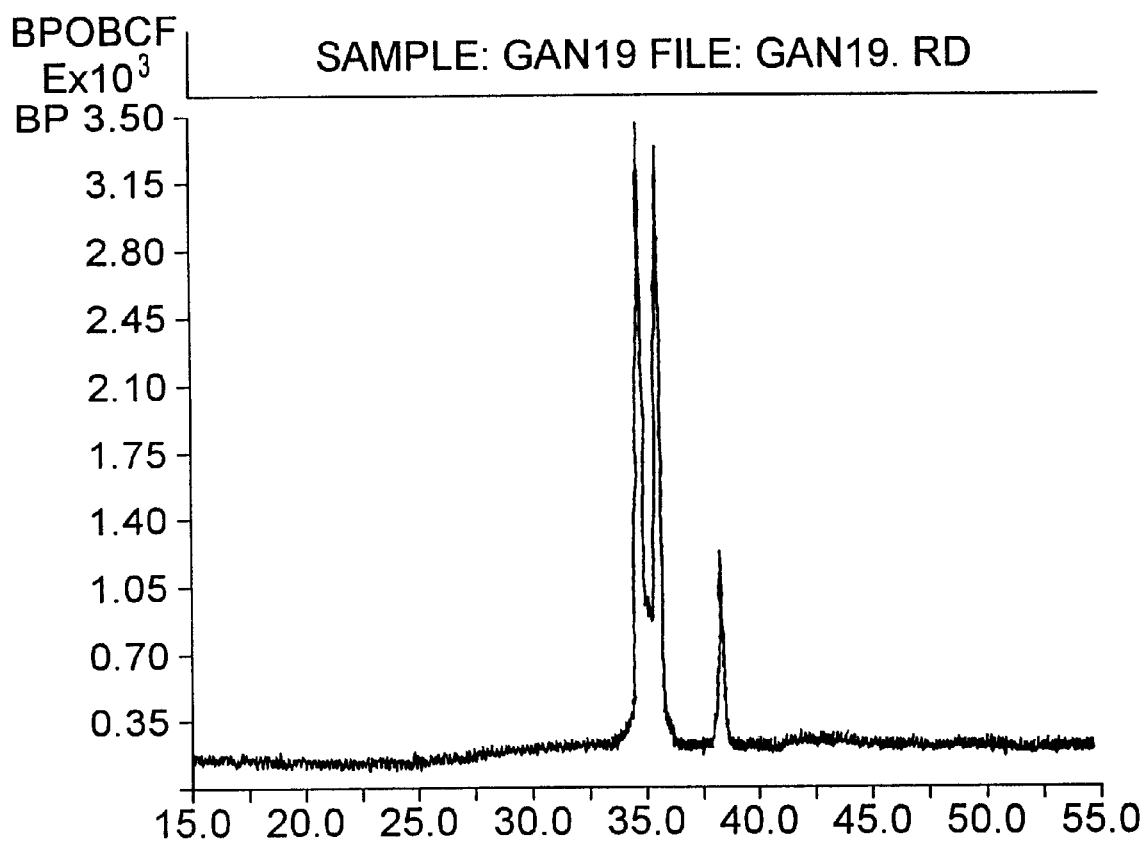
FIG. 2a is a an X-ray diffraction pattern from a GaN film on (11–20) sapphire grown from a one-step process.
Figure 2B:
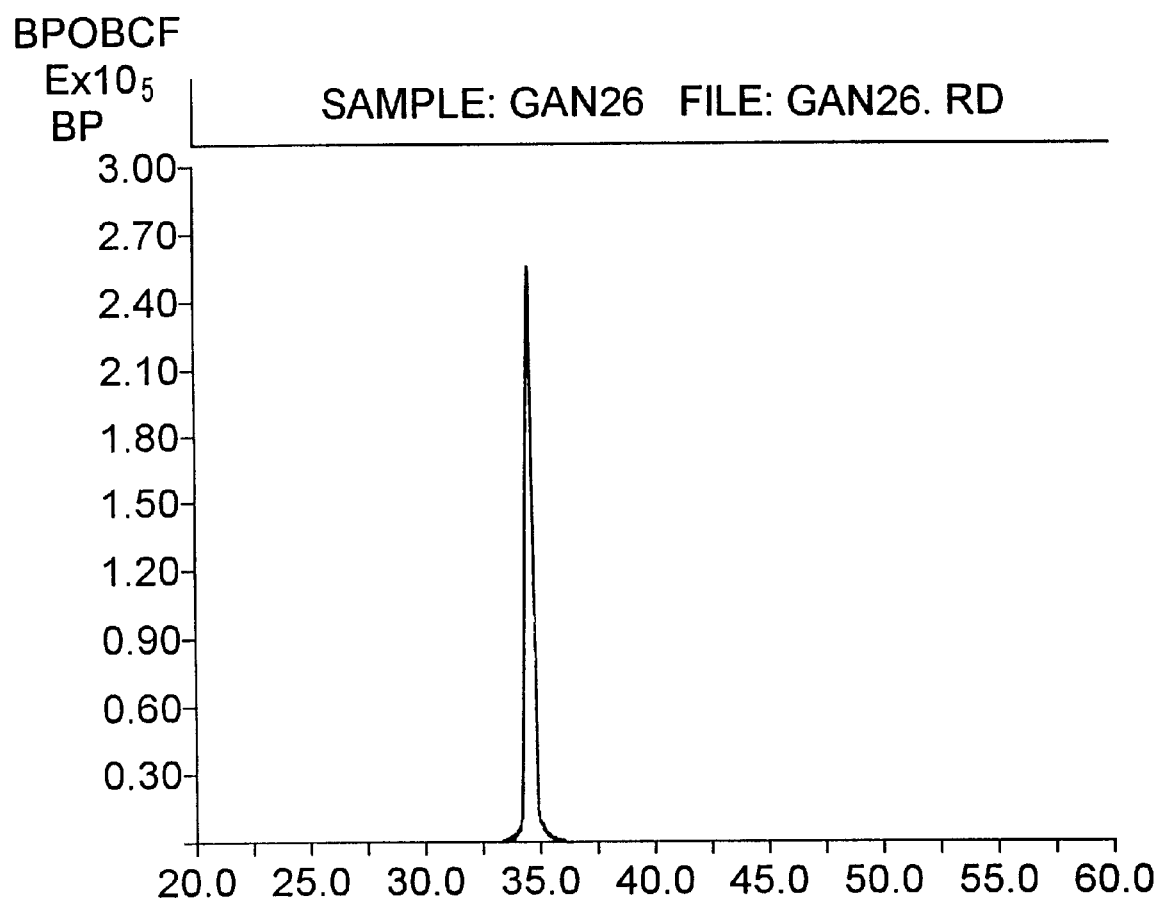
FIG. 2b is a an X-ray diffraction pattern from a GaN film on (11–20) sapphire grown from a two-step process.

FIG. 2 shows the X-ray diffraction (XRD) pattern of a GaN film grown on the α-plane of sapphire (11–20) in a one-step process (FIG. 2a) and a two-step process (FIG. 2b). The two peaks at ca. 2θ=35° of FIG. 2a are attributed to a defective GaN crystal. FIG. 2b has a single peak indicating a film of better quality. This is because the majority of the film grows on the top of the GaN buffer and does not see the underlying substrate. The growth layer of GaN "recognizes" the GaN buffer layer and on which it can grow without defects. The buffer is the only part of the film which is highly defective.

Films grown by the method described above were highly resistive at room temperature (10$^{10}$ Ω-cm) The mobility of this material is 10 cm$^2$V$^{-1}$s$^{-1}$, a reasonable value compared to the theoretic mobility of intrinsic GaN 330 which is Ω-cm$^{-3}$.

Figure 3:
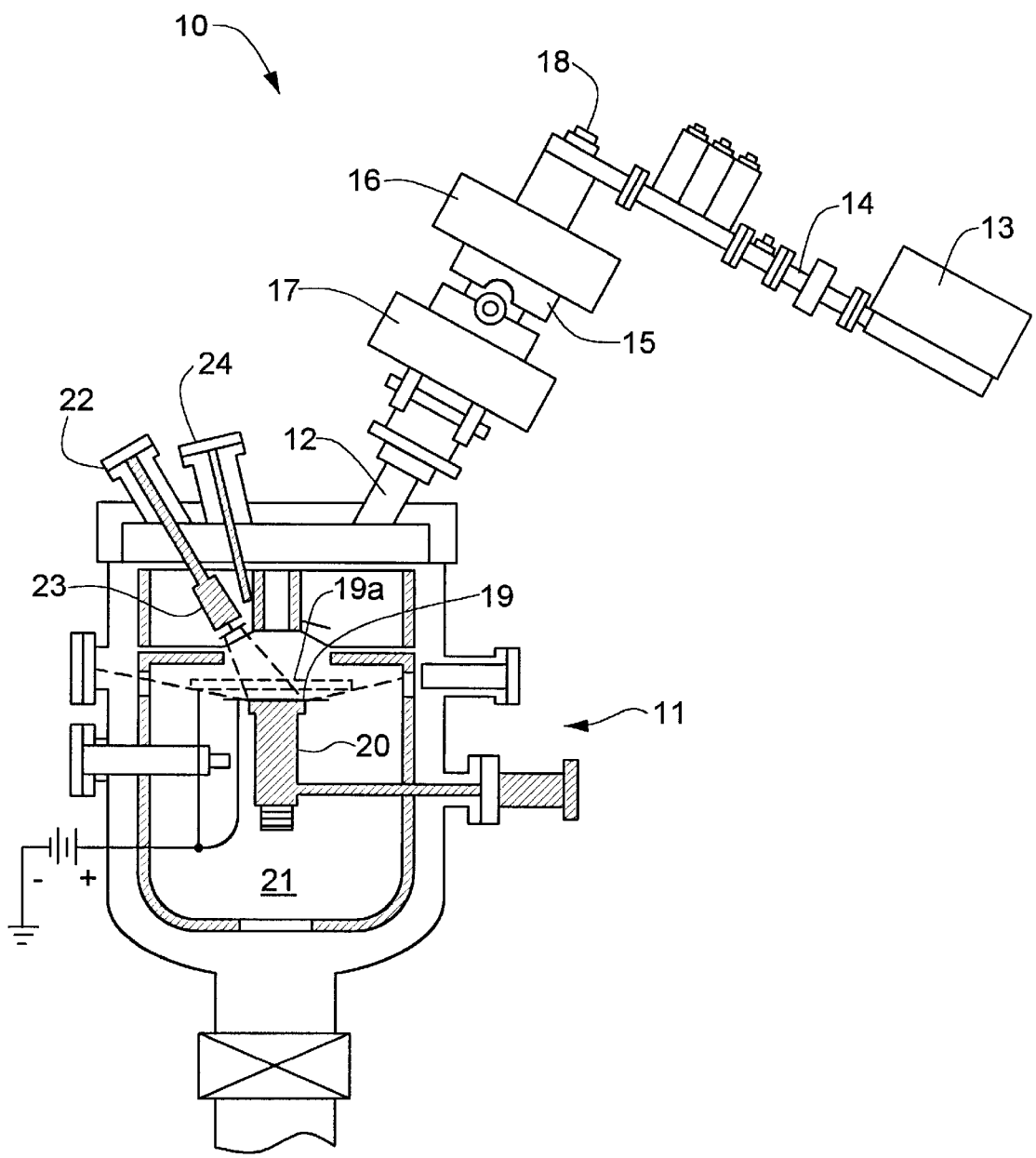
FIG. 3 is a schematic illustration of the method for doping GaN films.

GaN films are doped n-type or p-type by incorporating the proper impurities in their charged state. This is because the energy to incorporate a charged impurity into the lattice is lower than the energy needed to incorporate a neutral impurity. FIG. 3 is a schematic illustration of the doping of a charged acceptor into the GaN lattice. The substrate 19 or a grid 19a directly in front of it is positively biased. FIG. 3 shows both substrate 19 and grid 19a connected to a voltage source. In practice of this invention, either substrate 19 or grid 19a would be positively biased. Electrons are therefore attracted to the substrate surface, while positive ions such as N$^+$ are repelled. The growth process is carried out as described above with addition of an acceptor source 24 so that Ga, nitrogen and acceptor are deposited on the electron-rich surface of the substrate. As the acceptor atom approaches the surface, it takes on an electron and is incorporated into the lattice as a negative species, the energy of incorporation being lower than that of the neutral acceptor species. The same procedure is used to dope the GaN lattice with donor impurities, except that a negative bias is used on the substrate or the grid. Alternately, a charged surface can be generated by bombarding the substrate with electrons or positive ions. Electron guns and ion guns, respectively, are conventional sources of these species.

Suitable acceptor species include, but are not limited to, zinc, magnesium, beryllium, and calcium. Suitable donor species include, but are not limited to, silicon, germanium, oxygen, selenium and sulfur.

What is claimed is:

1. A method of preparing insulating monocrystalline Group III-nitride films comprising:
    providing in a molecular beam epitaxial growth chamber a single crystal substrate with the appropriate lattice match to the desired phase of the Group III-nitride film being grown;
    providing at least one molecular beam Group III source;
    providing an activated nitrogen source;
    opening the at least one molecular beam source; and
    exposing said substrate to said Group III and nitrogen sources to deposit a film at a low temperature;
    closing the at least one molecular beam source;
    raising the substrate temperature to above about 600° C.;
    maintaining the substrate temperature at about 600° C. to about 900° C. in the presence of only the nitrogen source; and
    opening the at least one molecular beam source to grow a layer of the Group III-nitride on the film.

2. A method of preparing doped p-type Group III-nitride films comprising:
    providing in a molecular beam epitaxial growth chamber a single crystal substrate with the appropriate lattice match to the desired phase of the Group III-nitride film being grown;
    providing a Group III source, an activated nitrogen source, and an acceptor source;
    opening the Group III source;
    exposing said substrate to said Group III and nitrogen sources to deposit a film at a low temperature;
    closing the Group III source;
    raising the substrate temperature to above about 600° C.;
    maintaining the substrate temperature at about 600° C. to about 900° C. in the presence of only the nitrogen source;
    opening the Group III source to grow a layer of the Group III-nitride on the film; and
    performing a growth step at a high temperature to deposit a film on said substrate, further comprising:
        negatively charging the substrate surface;
        exposing said surface to said gallium, nitrogen and acceptor sources; and
        depositing a doped Group III-nitride film, whereby said acceptor takes on an electron and enters into the lattice in its negatively charged state.

3. A method of preparing doped n-type Group III-nitride films comprising:
    providing in a molecular beam epitaxial growth chamber a single crystal substrate with the appropriate lattice match to a desired phase of the Group III-nitride file being grown;
    providing a Group III source, an activated nitrogen source, and a donor source;
    opening the Group III source;
    exposing said substrate to said Group III and nitrogen sources at a low temperature;
    closing the Group III source;
    raising the substrate temperature to above about 600° C.;
    maintaining the substrate temperature at about 600° C. to about 900° C. in the presence of only the nitrogen source;
    opening the Group III source to grow a layer of the Group III-nitride on the film; and
    performing a growth step at a high temperature to deposit a film on said substrate, further comprising:
        positively charging the substrate surface;
        exposing said surface to said Group III, nitrogen and donor sources; and
        depositing a doped Group III-nitride film, whereby said donor gives up an electron and enters into the lattice in its positively charged state.

4. A method of preparing Group III-nitride films comprising the steps of:
    disposing a substrate in a molecular beam epitaxial growth chamber;
    establishing a substrate temperature of about 100° C. to about 400° C.;
    opening a molecular element source;
    directing a molecular element at the substrate, the molecular element consisting essentially of a Group III element;
    directing activated nitrogen at the substrate;
    growing a nucleation layer of a Group III-nitride on the substrate;
    closing the molecular element source;
    raising the substrate temperature to above about 600° C. in a presence of activated nitrogen;
    maintaining the substrate temperature at about 600° C. to about 900° C. in a presence of activated nitrogen;
    re-opening the molecular element source; and
    growing a Group III nitride layer on the Group III-nitride nucleation layer.

5. The method of claim 4 further comprising the step of directing a dopant material at the substrate to grow a doped gallium nitride layer on the Group III nitride nucleation layer.

6. The method of claim 1 wherein said step of raising the substrate temperature continues for a period of time in a range of about 3 minutes to about 15 minutes.

7. The method of claim 1 wherein said step of exposing said substrate comprises a step of establishing a substrate temperature of about 100° C. to about 400° C.

8. The method of claim 2 wherein said step of raising the substrate temperature continues for a period of time in a range of about 3 minutes to about 15 minutes.

9. The method of claim 2 wherein said step of exposing said substrate comprises a step of establishing a substrate temperature of about 100° C. to about 400° C.

10. The method of claim 3 wherein said step of raising the substrate temperature continues for a period of time in a range of about 3 minutes to about 15 minutes.

11. The method of claim 3 wherein said step of exposing said substrate comprises a step of establishing a substrate temperature of about 100° C. to about 400° C.

12. The method of claim 4 wherein said step of raising the substrate temperature continues for a period of time in a range of about 3 minutes to about 15 minutes.

* * * * *

UNITED STATES PATENT AND TRADEMARK OFFICE
CERTIFICATE OF CORRECTION

PATENT NO.   : 6,123,768
DATED        : September 26, 2000
INVENTOR(S)  : Theodore D. Moustakas It is certified that error appears in the above-identified patent and that said Letters Patent is hereby corrected as shown below:

Column 1,
Lines 16 and 17, "monc-crystalfine", should read -- mono-crystalline --;
Line 21, "nitridie", should read -- nitride --;
Line 44, "$cm^{-1}$", should read -- $cm^{-3}$ --;
Line 46, "cessfiul", should read -- cessful --;
Line 51, "natures", should read -- nature --;
Line 55, "am", should read -- an --;
Line 55, "Monocrystailine", should read -- Monocrystalline --;

Column 2,
Line 11, "intric monocrystalle", should read -- intrinsic monocrystalline --;
Line 16, "tvwo", should read -- two --;
Line 23, "nct", should read -- not --;
Line 27, "call", should read -- can --;
Line 47, "monocrystaLlne", should read -- monocrystalline --;

Column 3,
Line 10, "a an", should read -- an --;
Line 12, "a an", should read -- an --; and
Line 32, "it", should read -- at --.

Signed and Sealed this

Sixteenth Day of October, 2001

Attest:

NICHOLAS P. GODICI
Attesting Officer  Acting Director of the United States Patent and Trademark Office